United States Patent
Leirer et al.

(10) Patent No.: US 10,424,698 B2
(45) Date of Patent: Sep. 24, 2019

(54) METHOD FOR PRODUCING OPTOELECTRONIC CONVERSION SEMICONDUCTOR CHIPS AND COMPOSITE OF CONVERSION SEMICONDUCTOR CHIPS

(71) Applicant: OSRAM Opto Semiconductors GmbH, Regensburg (DE)

(72) Inventors: Christian Leirer, Friedberg (DE); Korbinian Perzlmaier, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 15/735,945

(22) PCT Filed: Jun. 10, 2016

(86) PCT No.: PCT/EP2016/063328
§ 371 (c)(1),
(2) Date: Dec. 12, 2017

(87) PCT Pub. No.: WO2016/198620
PCT Pub. Date: Dec. 15, 2016

(65) Prior Publication Data
US 2018/0198037 A1    Jul. 12, 2018

(30) Foreign Application Priority Data

Jun. 12, 2015  (DE) .................. 10 2015 109 413

(51) Int. Cl.
*H01L 33/50*    (2010.01)
*H01L 25/075*   (2006.01)
(Continued)

(52) U.S. Cl.
CPC ........ *H01L 33/505* (2013.01); *H01L 25/0753* (2013.01); *H01L 33/0079* (2013.01);
(Continued)

(58) Field of Classification Search
CPC . H01L 25/0753; H01L 33/0079; H01L 33/44; H01L 33/50; H01L 33/505;
(Continued)

(56) References Cited

U.S. PATENT DOCUMENTS 5,019,771 A * 5/1991 Yang .................. G01R 1/06794
324/73.1
7,263,097 B1 * 8/2007 Ornes .................... H04Q 3/521
370/386
(Continued)

FOREIGN PATENT DOCUMENTS

DE   102004060358 A1   4/2006
DE   112014002241 T5   1/2016
(Continued)

*Primary Examiner* — Earl N Taylor
(74) *Attorney, Agent, or Firm* — Slater Matsil, LLP

(57) ABSTRACT

A method for producing optoelectronic conversion semiconductor chips and a composite of conversion semiconductor chips are disclosed. In an embodiment the method includes growing a semiconductor layer sequence on a growth substrate, applying an electric contact on to a rear side of the semiconductor layer sequence facing away from the growth substrate, thinning the growth substrate, after thinning, cutting the growth substrate at least to the semiconductor layer sequence thereby forming a first intermediate space, applying a conversion layer on to the thinned growth substrate and singulating at least the thinned growth substrate and the semiconductor layer sequence.

9 Claims, 17 Drawing Sheets

(51) Int. Cl.
  *H01L 33/00* (2010.01)
  *H01L 33/44* (2010.01)
  *H01L 33/38* (2010.01)
(52) U.S. Cl.
  CPC ............ *H01L 33/44* (2013.01); *H01L 33/382* (2013.01); *H01L 2933/0025* (2013.01); *H01L 2933/0033* (2013.01); *H01L 2933/0041* (2013.01)
(58) Field of Classification Search
  CPC . H01L 33/507; H01L 33/508; H01L 21/3043; H01L 21/78; H01L 21/82
  See application file for complete search history.

(56) References Cited

U.S. PATENT DOCUMENTS

| | | | | |
|---|---|---|---|---|
| 8,987,020 B2* | 3/2015 | Kojima | | H01L 33/382 438/26 |
| 9,472,729 B2* | 10/2016 | Hong | | H01L 24/97 |
| 9,490,398 B2* | 11/2016 | Oyamada | | H01L 33/50 |
| 9,520,543 B2* | 12/2016 | Chae | | H01L 33/62 |
| 9,780,078 B2* | 10/2017 | Hoeppel | | H01L 25/167 |
| 9,847,445 B2* | 12/2017 | Wei | | H01L 33/0095 |
| 2004/0129991 A1* | 7/2004 | Lai | | H01L 31/0203 257/433 |
| 2004/0174535 A1* | 9/2004 | Kuramoto | | G01J 9/02 356/515 |
| 2005/0130390 A1* | 6/2005 | Andrews | | B23K 26/0057 438/458 |
| 2006/0003477 A1* | 1/2006 | Braune | | H01L 33/505 438/29 |
| 2007/0212854 A1* | 9/2007 | Chu | | H01L 33/0079 438/464 |
| 2008/0143379 A1* | 6/2008 | Norman | | H01L 23/50 326/39 |
| 2008/0173884 A1* | 7/2008 | Chitnis | | H01L 33/44 257/98 |
| 2008/0179611 A1* | 7/2008 | Chitnis | | H01L 33/508 257/98 |
| 2008/0203410 A1* | 8/2008 | Brunner | | H01L 33/508 257/98 |
| 2008/0277765 A1* | 11/2008 | Lane | | H01L 21/563 257/622 |
| 2009/0014736 A1* | 1/2009 | Ibbetson | | H01L 33/44 257/98 |
| 2009/0212407 A1* | 8/2009 | Foster | | B81B 7/0006 257/686 |
| 2010/0148198 A1* | 6/2010 | Sugizaki | | H01L 33/44 257/98 |
| 2010/0171134 A1* | 7/2010 | Shao | | H01L 33/507 257/98 |
| 2010/0320479 A1* | 12/2010 | Minato | | H01L 33/505 257/88 |
| 2011/0073889 A1* | 3/2011 | Sugizaki | | H01L 33/44 257/98 |
| 2011/0266560 A1* | 11/2011 | Yao | | H01L 33/0079 257/88 |
| 2011/0267087 A1* | 11/2011 | Huang | | G01R 31/2635 324/754.23 |
| 2011/0297980 A1* | 12/2011 | Sugizaki | | H01L 33/38 257/98 |
| 2011/0297994 A1* | 12/2011 | Sugizaki | | H01L 25/0753 257/99 |
| 2012/0091481 A1* | 4/2012 | Sekine | | H01L 33/486 257/88 |
| 2012/0193649 A1* | 8/2012 | Donofrio | | H01L 25/0753 257/88 |
| 2012/0305957 A1* | 12/2012 | Gandhi | | H01L 33/0079 257/98 |
| 2013/0264589 A1* | 10/2013 | Bergmann | | H01L 33/62 257/88 |
| 2013/0264592 A1* | 10/2013 | Bergmann | | H01L 33/50 257/88 |
| 2014/0051194 A1* | 2/2014 | Herrmann | | H01L 33/0079 438/27 |
| 2015/0064808 A1* | 3/2015 | Wei | | H01L 33/0079 438/5 |
| 2015/0108510 A1* | 4/2015 | Urano | | H01L 33/486 257/88 |
| 2015/0129918 A1* | 5/2015 | Ikegami | | H01L 33/505 257/98 |
| 2015/0207046 A1* | 7/2015 | Ikegami | | H01L 33/505 257/98 |
| 2015/0243853 A1* | 8/2015 | Cha | | H01L 33/486 438/27 |
| 2016/0087174 A1* | 3/2016 | Bhat | | H01L 33/58 438/29 |
| 2016/0126429 A1* | 5/2016 | Mahowald | | H01L 33/505 257/98 |
| 2016/0163931 A1* | 6/2016 | Schricker | | H01L 33/501 257/98 |
| 2016/0268491 A1* | 9/2016 | Wu | | H01L 22/20 |
| 2016/0276546 A1* | 9/2016 | Lee | | H01L 33/502 |
| 2016/0351620 A1* | 12/2016 | Tanaka | | H01L 33/50 |
| 2017/0294418 A1* | 10/2017 | Edmond | | H01L 25/0753 |
| 2017/0317230 A1* | 11/2017 | An | | H01L 33/0079 |
| 2018/0033923 A1* | 2/2018 | Schricker | | H01L 27/156 |

FOREIGN PATENT DOCUMENTS

| | | | | |
|---|---|---|---|---|
| EP | 2325906 A1 * | 5/2011 | ......... | H01L 33/507 |
| JP | 2004221536 A | 8/2004 | | |
| JP | 2010517289 A | 5/2010 | | |
| JP | 2011108911 A | 6/2011 | | |
| WO | 2013109774 A1 | 7/2013 | | |
| WO | 2013150427 A1 | 10/2013 | | |
| WO | 2014178583 A1 | 11/2014 | | |
| WO | WO 2015011583 A1 * | 1/2015 | ......... | H01L 33/0079 |

* cited by examiner

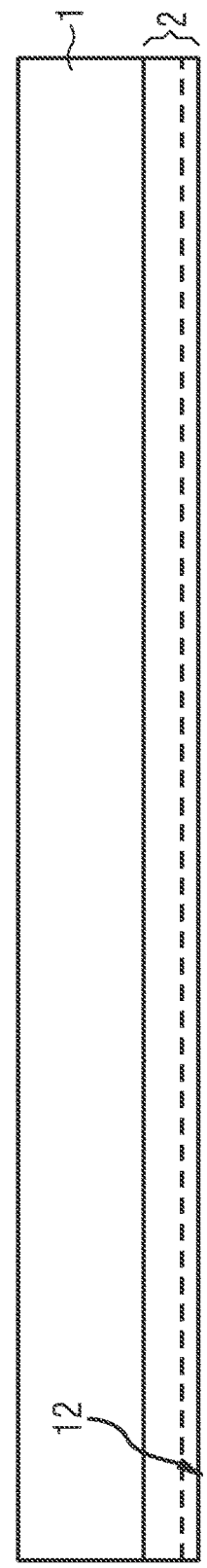
FIG 1A
FIG 1B

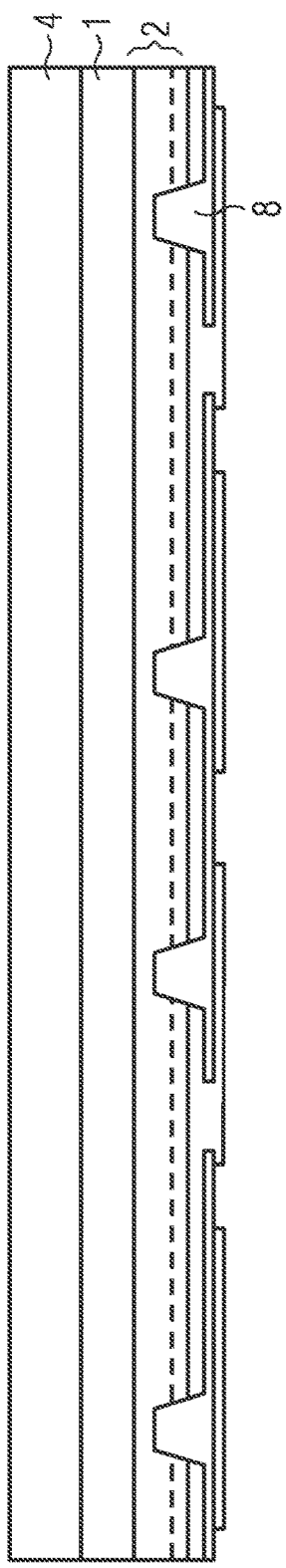
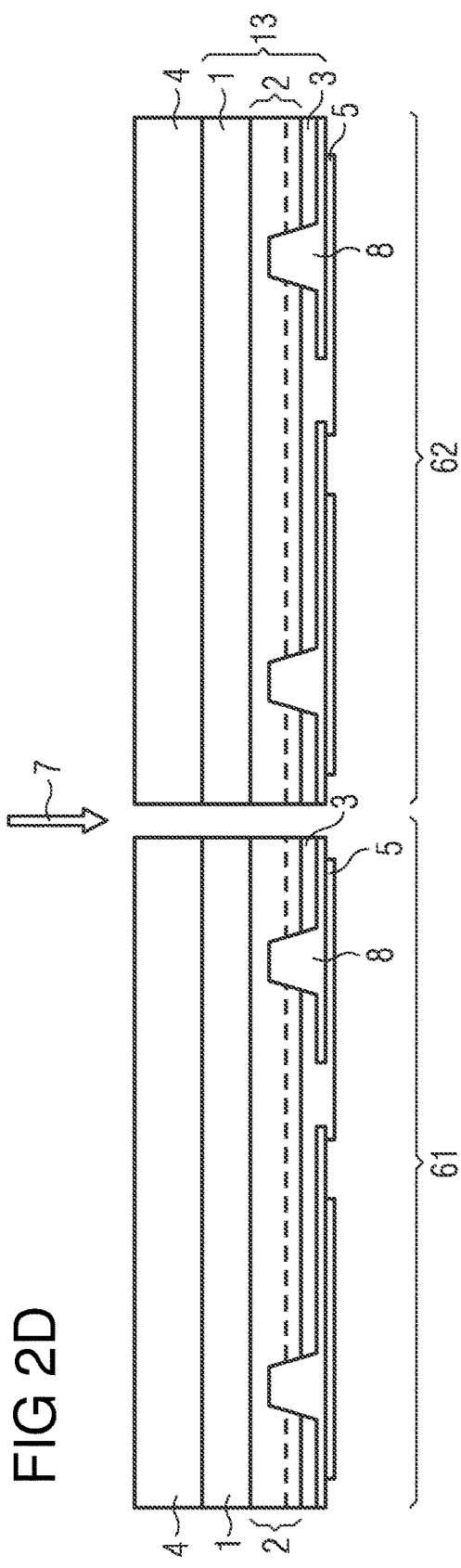

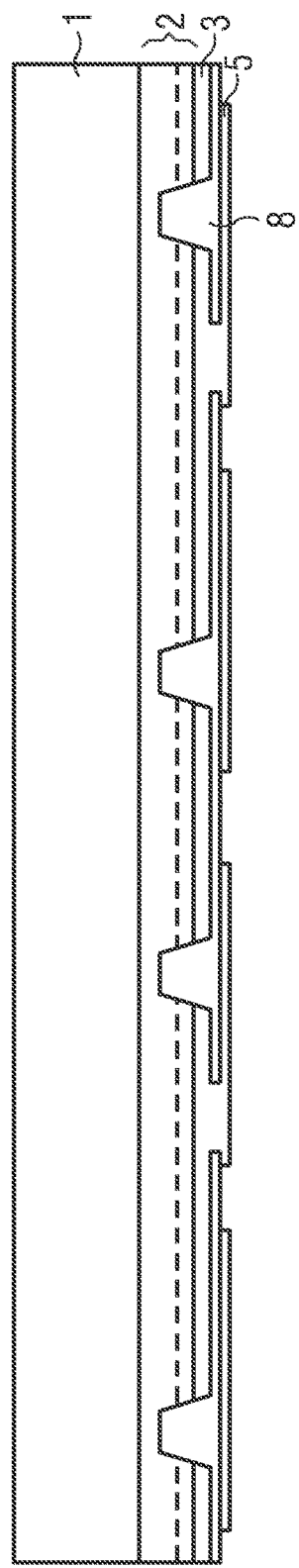
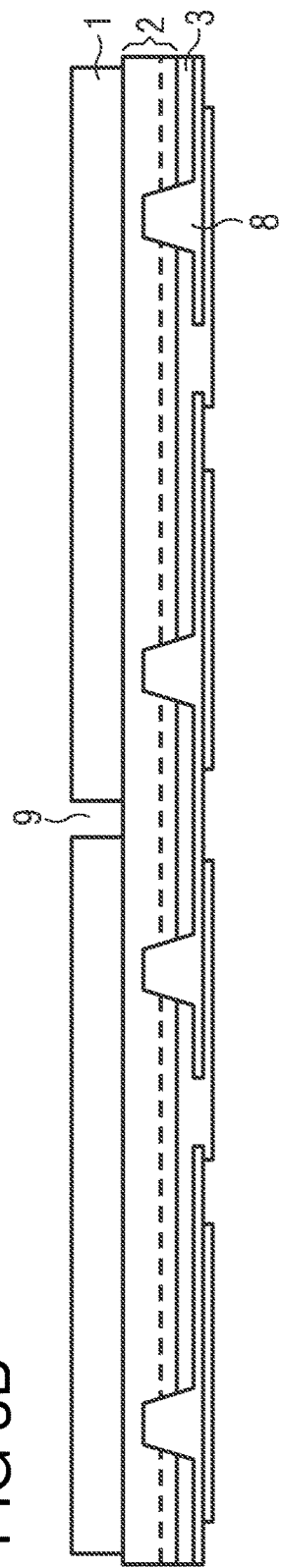
FIG 3A
FIG 3B

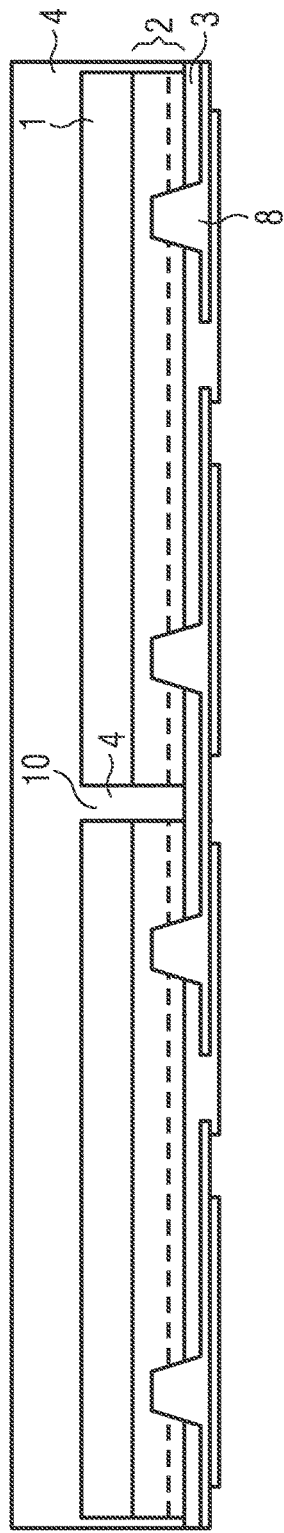
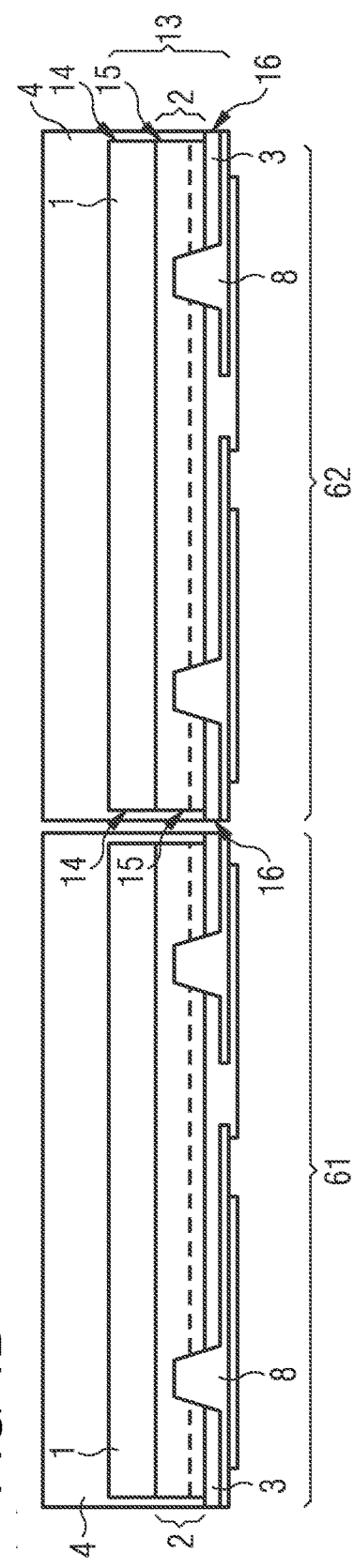

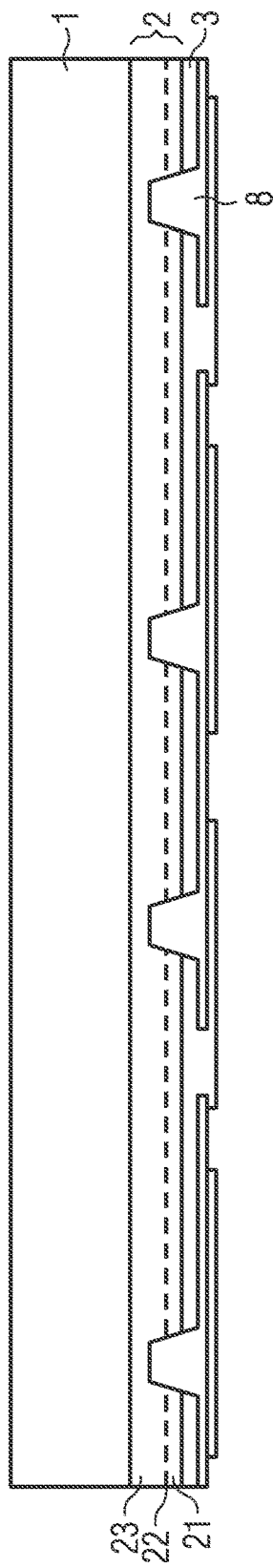
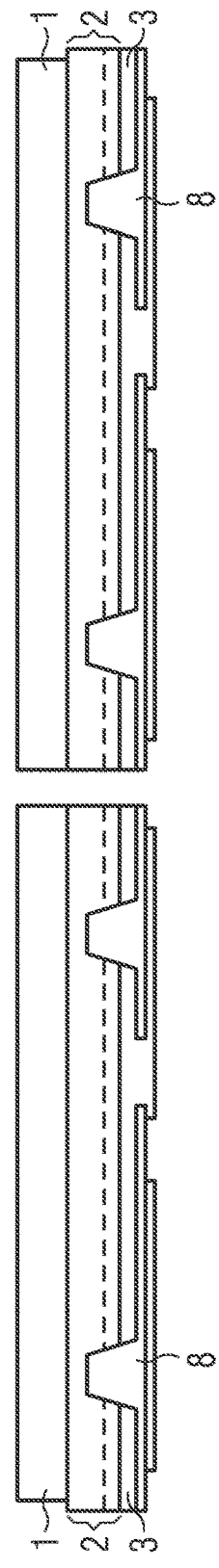

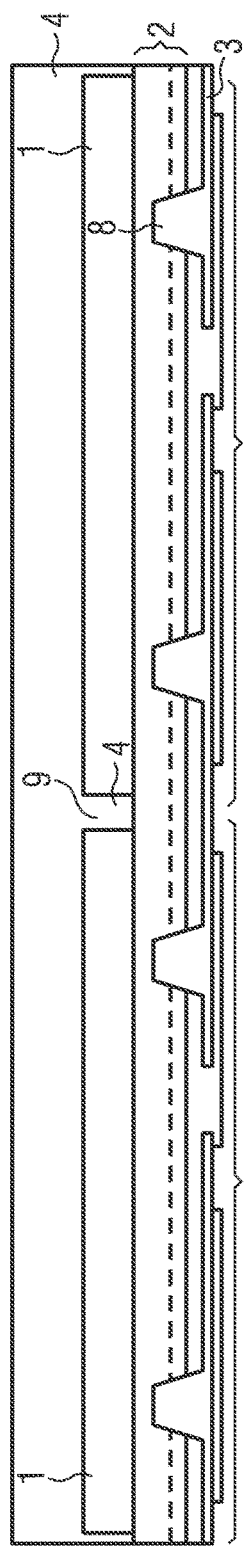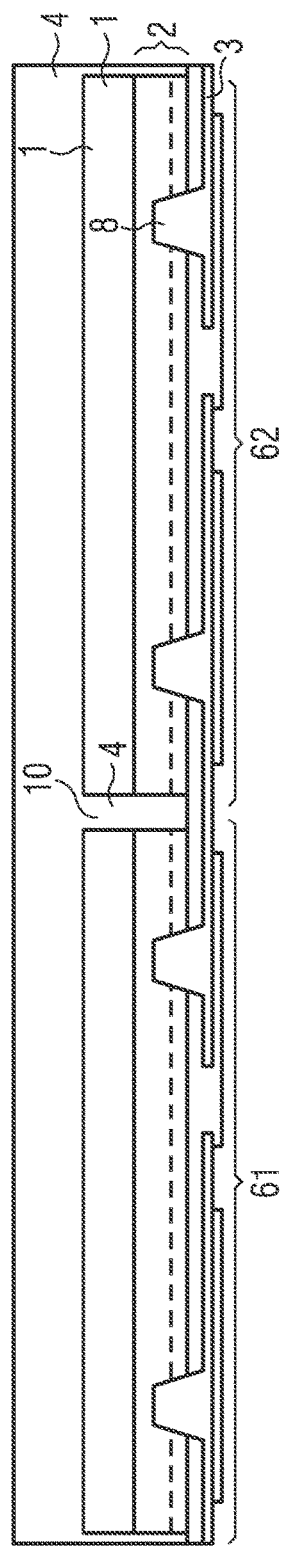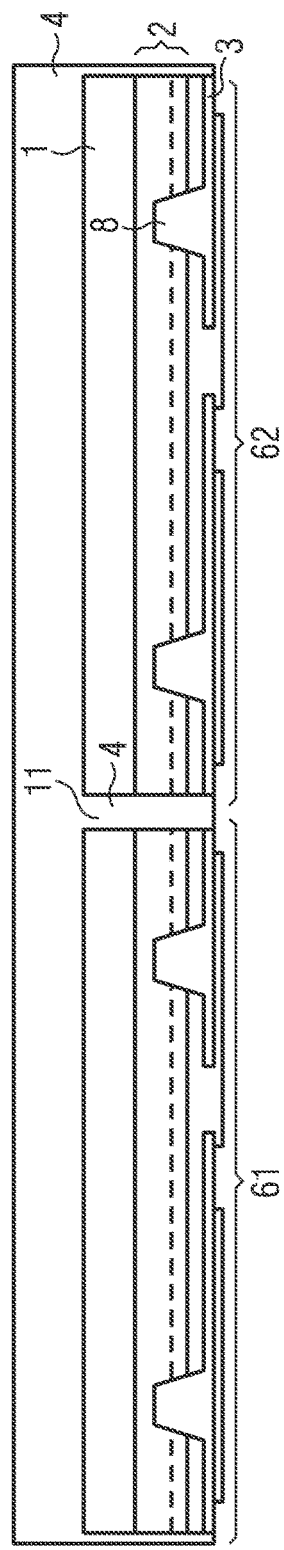

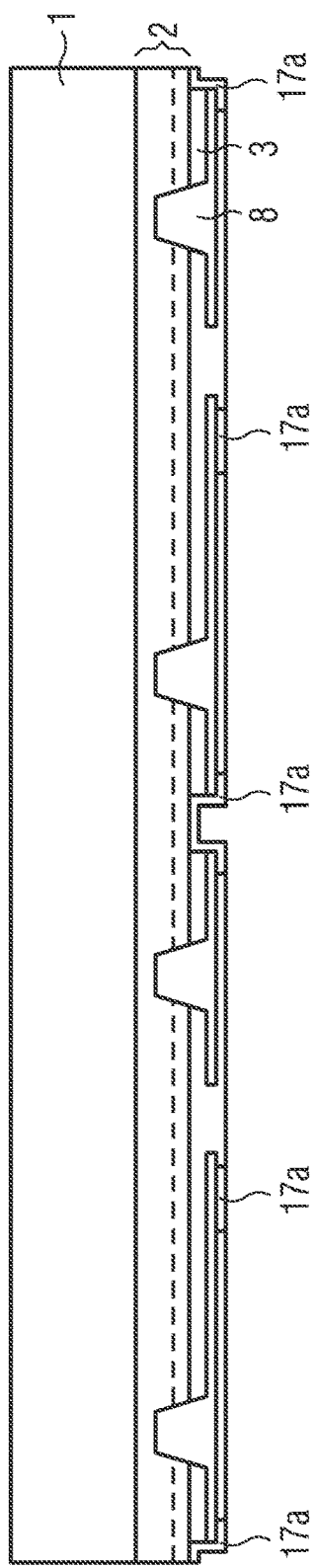
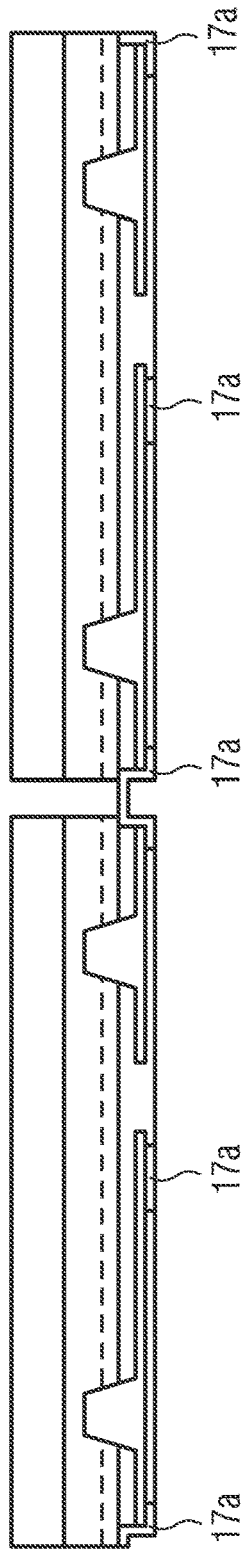

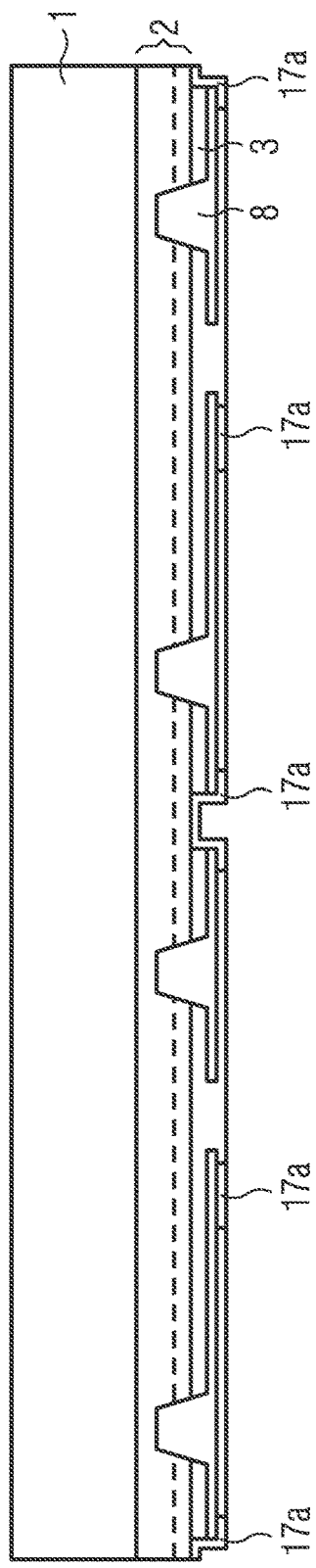
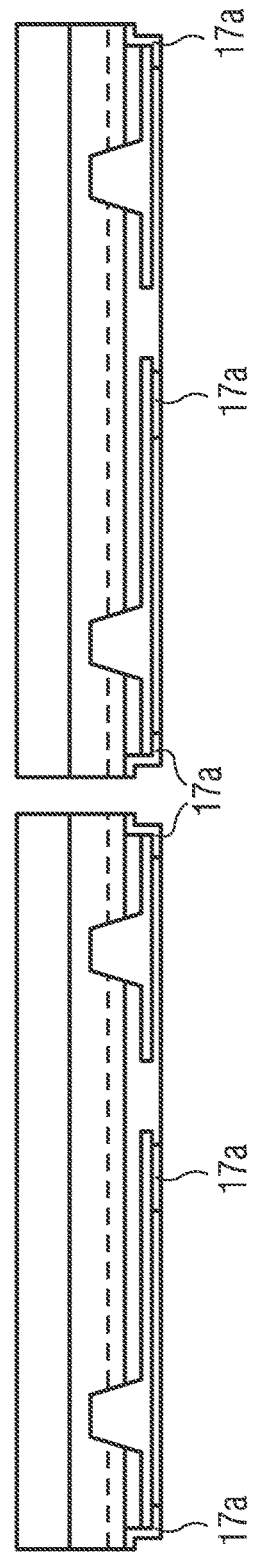
FIG 9A
FIG 9B

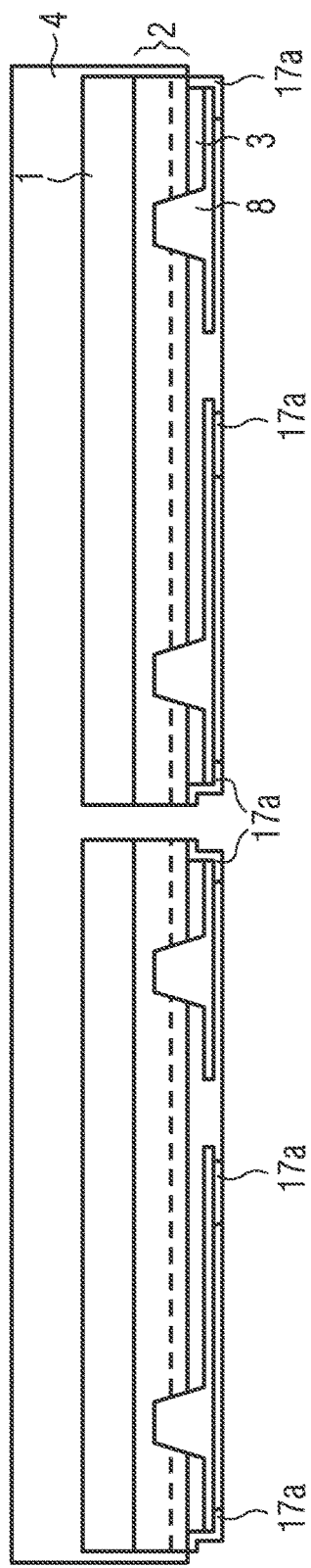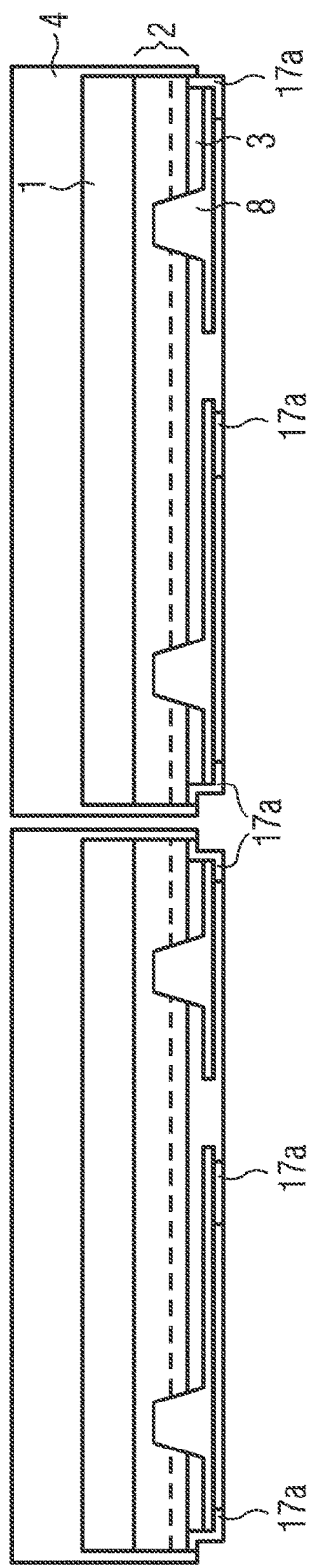

METHOD FOR PRODUCING OPTOELECTRONIC CONVERSION SEMICONDUCTOR CHIPS AND COMPOSITE OF CONVERSION SEMICONDUCTOR CHIPS

This patent application is a national phase filing under section 371 of PCT/EP2016/063328, filed Jun. 10, 2016, which claims the priority of German patent application 10 2015 109 413.4, filed Jun. 12, 2015, each of which is incorporated herein by reference in its entirety.

TECHNICAL FIELD

The invention relates to a method for producing optoelectronic conversion semiconductor chips. Furthermore, the invention relates to a composite of conversion semiconductor chips.

BACKGROUND

For the production of conversion semiconductor chips, it is common to apply a conversion layer on to the completely-processed semiconductor chips. To that end, the completely-processed semiconductor chips is applied on to a temporary carrier. To that end, each individual semiconductor chip must be gripped and relocated, and coated with the conversion layer then. This is elaborate and cost-intensive.

SUMMARY OF THE INVENTION

Embodiments of the invention provide a method for producing optoelectronic conversion semiconductor chips, which enables a simple production of these conversion semiconductor chips. Further embodiments of the invention provide a more cost-efficient method for producing optoelectronic conversion semiconductor chips.

In at least one configuration, the method for producing optoelectronic conversion semiconductor chips comprises the steps: A) Providing a growth substrate, B) Growing a semiconductor layer sequence on the growth substrate, C) Applying an electric contact on to the rear side of the semiconductor layer sequence facing away from the growth substrate, D) Thinning the growth substrate, E) Applying the conversion layer on to the thinned growth substrate, and F) Singulating at least the thinned growth substrate and the semiconductor layer sequence for the generation of at least two optoelectronic conversion semiconductor chips.

Optoelectronic conversion semiconductor chips are produced in the method described here. This means that at least two conversion semiconductor chips are produced. In particular, more than two conversion semiconductor chips are produced, in particular a plurality of conversion semiconductor chips, which are located in particular on a wafer composite.

According to at least one embodiment, the method includes the production of at least two conversion semiconductor chips. The conversion semiconductor chip in particular is a light-emitting diode, LED for short. Now, the semiconductor chip is preferably configured to emit blue light or white light. In particular, the conversion layer is configured to convert the radiation emitted by the semiconductor chip into white light, in particular radiation emitted by the semiconductor chip of the blue range.

According to at least one embodiment, the conversion semiconductor chip is a flip chip. Here and in the following, this means that the conversion semiconductor chips all have their electric contacts arranged on a main surface, via which the conversion semiconductor chips are in each case mounted on carriers, in particular a final carrier. The final carrier can be a housing, a ceramic or a metal core circuit board. Such conversion semiconductor chips have the advantage that, e.g., additional electric contacts, e.g., in the form of bond wires, are no longer required for the electrical connection.

According to at least one embodiment, a growth substrate is provided in the method. The growth substrate can include an insulator material or a semiconductor material, e.g., a III-V semiconductor compound material. In particular, the growth substrate can include sapphire, GaAs, GaP, GaN, InP, SiC, Si and/or Ge or be made of such a material.

After the provision of a growth substrate in method step A), the growth substrate can be thinned in a subsequent method step D). Here and in the following, this means that the layer thickness of the growth substrate is decreased.

In particular, the layer thickness of the growth substrate is decreased by the factor 2 to 10, e.g., 10. For example, the layer thickness of the growth substrate is decreased from 1 mm to 100 µm or from 700 µm to 250 µm or 300 µm. Thinning can be carried out by grinding and/or plasma processes.

According to at least one embodiment, the method comprises a method step B), growing a semiconductor layer sequence on to the growth substrate. In particular, growing is carried out over the entire surface, i.e., on the entire growth substrate. As used herein, the fact that a layer or an element is arranged or applied or grown "on" or "over" another layer or another element can mean that the one layer or the one element are directly arranged on the other layer or the other element in direct mechanical and/or electric contact. Furthermore, it can also mean that the one layer or the one element is arranged indirectly on or over the other layer or the other element. In this case, further layers and/or elements can be arranged between one and the other layer or between one and the other element.

According to at least one embodiment, the resulting conversion semiconductor chips each comprise a semiconductor layer sequence. Preferably, the semiconductor layer sequence of the conversion semiconductor chips are each based on a III-V semiconductor compound material. The semiconductor material can preferably be based on nitride semiconductor compound material. The phrase "based on a nitride semiconductor compound material" means in this context that the semiconductor layer sequence or at least one layer thereof includes a III nitride semiconductor compound material, preferably $In_xAl_yGa_{1-x-y}N$, with $0 \leq x \leq 1$, $0 \leq y \leq 1$, and $x+y \leq 1$. Here, this material does not necessarily have a mathematically exact composition according to the above formula. It may rather comprise one or more dopants as well as additional constituents, which do not substantially change the characteristic physical properties of the $In_xAl_yGa_{1-x-y}N$ material. For the sake of simplicity, the above formula only includes the essential constituents of the crystal lattice (In, Al, Ga, N), even if these can partly be replaced by slight amounts of further substances. The semiconductor layer sequence can include aluminum nitride and/or silicon nitride.

The semiconductor layer sequence includes an active layer having at least one p-n-junction and/or one multiple quantum well structures. During operation of the conversion semiconductor chips, electromagnetic radiation is generated in the active layer. A wavelength or the wavelength maximum of the radiation preferably is in the ultraviolet and/or visible spectral range, in particular at wavelengths between 400 nm and 680 nm inclusive, e.g., between 440 nm and 480 nm inclusive.

According to at least one embodiment, the method comprises a method step C), applying an electric contact on to the rear side of the semiconductor layer sequence facing away from the growth substrate. The rear side of the semiconductor layer sequence facing away from the growth substrate means that the rear side is oriented perpendicularly to a growth direction of the semiconductor layer sequence of the conversion semiconductor chips. In particular, the rear side is arranged in the opposite side of the growth substrate of the semiconductor layer sequence, i.e., facing away from the growth substrate.

The resulting conversion semiconductor chips can each include at least the electric contact and a further electric contact. The electric contacts serve for electrically contacting the conversion semiconductor chips. In particular, the electric contact is a p-connection contact, i.e., a contact which electrically contacts at least one p-doped semiconductor layer of the semiconductor layer sequence. In particular, the further electric contact is an n-connection contact, i.e., a contact which electrically contacts at least one n-doped semiconductor layer of the semiconductor layer sequence. The electric contacts can, e.g., comprise at least one of the metals gold, silver, titanium, platinum, palladium, copper, nickel, indium, rhodium, chromium, aluminum or tungsten. These metals can, e.g., be deposited by vaporization, sputtering or electrochemical deposition processes, e.g., galvanically.

In particular, the electric contacts are separated from one another by at least one insulator layer to prevent a short-circuit. The electric contact and/or the further electric contact can be formed as a layer.

In particular, the growth process can be affected in the wafer composite. In other words, a growth substrate is provided in the form of a wafer, e.g., a sapphire wafer, on which the semiconductor layer sequence is grown over a large area. In a further method step, the grown semiconductor layer sequence can be singulated into individual semiconductor chips, in particular conversion semiconductor chips, wherein the side surfaces of the semiconductor chips can be formed by the singulation.

According to at least one embodiment, the method comprises a method step E), applying the conversion layer on to the thinned growth substrate. In particular, the conversion layer is applied over the entire surface on to the thinned growth substrate. In particular, application is effected in direct mechanical contact on to the thinned growth substrate.

In particular, the conversion layer is configured to convert the primary radiation emitted by the semiconductor layer sequence at least partially in secondary radiation different from the primary radiation.

For example, the primary radiation can have a wavelength range from an ultraviolet to green wavelength range, while the secondary radiation has a wavelength range from a blue to infrared wavelength range. Particularly preferably, the primary radiation and the secondary radiation can arouse a white luminous impression when superposed. To that end, the primary radiation can arouse a blue-colored luminous impression and the secondary radiation can arouse a yellow-colored luminous impression, which can be achieved by spectral components of the secondary radiation in the yellow wavelength range and/or spectral components in the green and red wavelength range.

According to at least one embodiment, the primary radiation is selected from a blue spectral range, in particular from 440 nm to 480 nm. According to at least one embodiment, the secondary radiation is selected from a wavelength range between 515 nm to 560 nm and/or 600 nm to 750 nm. The conversion layer comprises a conversion material, which in particular is configured to absorb the primary radiation emitted by the semiconductor layer sequence, i.e., the active region of the semiconductor layer sequence, at least partially and emit it as a secondary radiation with a wavelength range at least partially different from the primary radiation during the operation of the conversion semiconductor chips. The conversion layer can be formed as a layer foil or as a layer system. As used herein, the term layer system means that the conversion layer is composed of sub-layers having different conversion materials, wherein differently configured conversion materials are present in the individual sub-layers.

The conversion material can be a luminescent substance. The luminescent substance can be distributed in a matrix material. In particular, polymer or ceramics materials are used as matrix material. The matrix material can be selected from a group including siloxanes, oxides, acrylates, silicones, methyl acrylates, imides, carbonates, olefins, styrenes, urethanes, derivates and mixtures thereof, copolymers and compounds thereof. These compounds can be present in the form of monomers, oligomers or polymers. For example, the matrix material can include or be an epoxy resin, PMMA, polystyrene, polycarbonate, polyacrylate, polyurethane, or a silicon resin, such as poly-siloxane or mixtures thereof.

The conversion material can be selected from a group that includes garnets, calsines, quantum dots and rare earth doped orthosilicates.

A garnet can be an yttrium aluminum garnet, YAG for short. This is in particular doped with Cer.

A calsin is, e.g., a $Ca_{1-x}Eu_xAlSiN_3$ with x=0-0.2. In particular, Ca can at least partially be replaced by strontium and/or barium.

A rare earth-doped orthosilicate can be $Sr_2SiO_4$:Eu, for example.

According to at least one embodiment, the conversion layer can additionally include a filler such as a metal oxide, e.g., titanium dioxide, zirconium dioxide, zinc oxide, aluminum oxide, a salt barium sulfate, and/or glass particles. The filler can be configured to scatter the primary radiation emitted by the semiconductor chip at least partially und/or to scatter the radiation absorbed by the semiconductor layer sequence.

In method E), the conversion layer can be applied in liquid form. This particularly means that the solid conversion material is dispersed in a liquid phase of the matrix material and both are applied together. As the case may be, the liquid matrix material and the conversion material can be applied on to the semiconductor layer sequence with the active region, for example. In particular, the matrix material and the conversion material are applied directly on to the growth substrate.

According to at least one embodiment, step D) is carried out by means of molding, spray-coating, or potting. In particular, the conversion layer is applied as a paste, granulate, liquid and/or solution. As an alternative, the conversion layer may also be laminated-on.

According to at least one embodiment, the method includes a method step F), singulating at least the thinned growth substrate and the semiconductor layer sequence for generating at least two optoelectronic conversion semiconductor chips. However, in particular, more than two conversion semiconductor chips are produced, e.g., more than 100 or 200 conversion semiconductor chips.

According to at least one embodiment, method step F) is carried out by means of sawing, stealth dicing, laser separation or scoring and breaking.

Scoring and breaking particularly means that at least the growth substrate is at least slightly scored mechanically, e.g., by means of a diamond score, or by means of a laser, and subsequently broken.

According to at least one embodiment, in step D) an additional step D1) is carried out, cutting the growth substrate at least or exactly down to the semiconductor layer sequence for forming a first intermediate space. Here, the conversion layer is additionally arranged in the intermediate space in step E). In other words, the growth substrate is cut vertically at least to or exactly to the semiconductor layer sequence in a side view of the conversion semiconductor chips here. This particularly means that the semiconductor layer sequence is in particular not damaged. Then, a first intermediate space is formed, i.e., a space between the neighboring resulting conversion semiconductor chips prior to the singulation of these chips. In step E), the conversion layer additionally arranges in this first intermediate space. In particular, the conversion layer covers the first intermediate space in a form-fit manner and/or directly, i.e., in direct mechanical contact. The first intermediate space extends only through the growth substrate, but not through the semiconductor layer sequence. After step F), in particular optoelectronic conversion semiconductor chips, which comprise side flanks free from the conversion layer, are generated.

As an alternative or in addition, after step D), an additional step D2) can be carried out, cutting the growth substrate and the semiconductor layer sequence to the electric contact for forming a second intermediate space. As an alternative, instead of cutting down to the electric contact, cutting to a dielectric or a metal layer can be carried out, in particular when neighboring semiconductor chips do not comprise a common electric contact since the latter has already been cut before. In particular, the electric contact or the dielectric are formed as a layer. In step E), the conversion layer is additionally arranged in this second intermediate space, wherein after step F) optoelectronic conversion semiconductor chips are generated, which comprise side flanks that are at least partially covered with the conversion layer. In other words, the growth substrate the semiconductor layer sequence is completely cut vertically in a side view. Then, a second intermediate space is formed. The at last one electric contact, the dielectric or the metal layer is not cut. The conversion layer is arranged in this second intermediate space in particular in direct mechanical contact and/or in a form-fit manner. Here and in the following, side flanks refers to the side surfaces of the respective conversion semiconductor chips, i.e., the side surfaces of the growth substrate and of the semiconductor layer sequence. These side surfaces are at least partially covered with the conversion layer. In particular, the side surfaces of the growth substrate and of the semiconductor layer sequence are completely covered with the conversion layer. In particular, the side surface of the first contact, which in particular is formed as a layer, is free from the conversion layer.

Alternatively or in addition, after step D), an additional step D4) is performed, cutting the growth substrate and the semiconductor layer sequence and the electric contact for forming a third intermediate space, wherein the conversion layer in step E) is additionally arranged in the third intermediate space, wherein after step F) optoelectronic semiconductor chips are generated, which comprise side flanks that are covered completely with the conversion layer. Alternatively, instead of the electric contact, a dielectric or a metal layer can be cut, in particular in the case that neighboring semiconductor chips do not have a common electric contact before being singulated, since this contact has already been cut before. In other words, in a side view, both the growth substrate and the semiconductor layer sequence and the electric contact or the dielectric or the metal layer, which is arranged in the rear side of the semiconductor layer sequence, is completely cut. As a result, an intermediate space is formed between neighboring conversion semiconductor chips, in this case referred to as a third intermediate space. This third intermediate space is completely filled with the conversion layer in step E), in particular in a form-fit manner. As a result, conversion semiconductor chips can be generated in the direct processing, which cover both the side flanks, i.e., the side surfaces of the growth substrate and of the semiconductor layer sequence and of the electric contact, and the surface of the growth substrate with the conversion layer. In particular, the conversion layer is completely arranged on the side flanks of the conversion semiconductor chips.

According to at least one embodiment, first the first intermediate space, then the second intermediate space and finally the third intermediate space is formed in one process. In other words, the intermediate spaces are formed one after the other in one process.

According to at least one embodiment, after step D) and/or prior to step D4), an additional step D3) is carried out, applying at least the growth substrate and the semiconductor layer sequence and the electric contact on to the temporary carrier, wherein in step D4), first the growth substrate, then the semiconductor layer sequence, and then the electric contact are cut, wherein the temporary carrier is not cut, i.e., is present in an uncut form. Alternatively, instead of the electric contact, a dielectric or a metal layer can be present, which is applied in step D3) and cut in step D4). In particular, the temporary carrier is removed again after step E) or step F). The temporary carrier can, e.g., be a foil, a circuit board or generally a board, which is formed with a plastic material, a metal, a ceramic material or a semimaterial. In particular, the temporary carrier is arranged on the side of the semiconductor layer sequence or of the electric contact facing away from the growth substrate.

According to at least one embodiment, prior to step D), i.e., prior to the thinning of the growth substrate, a cutting of the electric contact and of the semiconductor layer sequence and at least partially of the growth substrate is carried out. Cutting is carried out from the side facing away from the growth substrate. In other words, first the electric contact and then the semiconductor layer sequence and subsequently at least partially the substrate is cut. As an alternative, instead of the electric contact, a dielectric or a metal layer can be present, which is cut then. In the subsequent method step D), the growth substrate is ground all the way down to this cut region. In this case, semiconductor chips that are separated from one another can be generated. In particular, these semiconductor chips do not have a conversion layer.

According to at least one embodiment, the conversion layer comprises a layer thickness of 1 μm to 1 mm at the side flanks of the conversion semiconductor chips, in particular of 20 μm to 400 μm. Alternatively or additionally, the conversion layer can have a layer thickness of 20 μm to 400 μm on the growth substrate. In particular, the layer thickness of the conversion layer is the same on the growth substrate and on the side flanks.

According to at least one embodiment, after step F), steps G) and/or H) are additionally carried out. Step G) includes the testing of the optoelectronic conversion semiconductor chips. This particularly means that the conversion semiconductor chips are tested in terms of functionality or serviceability. The method step H) includes the packaging of the optoelectronic conversion semiconductor chips, in particular the packaging for sale.

Furthermore, a composite of conversion semiconductor chips is provided. The method for producing conversion semiconductor chips preferably produces a composite of conversion semiconductor chips. In other words, all features disclosed for the method are also disclosed for the composite of conversion semiconductor chips and vice versa.

In this case, the term composite particularly means a wafer composite. In particular, a plurality of generated and produced conversion semiconductor chips are arranged on a common carrier substrate or growth substrate. In particular, more than 100 conversion semiconductor chips are arranged on this common substrate.

According to at least one embodiment, the composite of conversion semiconductor chips includes in each case one semiconductor layer sequence with at least one n-doped semiconductor layer and at least one p-doped semiconductor layer. An active layer is arranged between the at least one n-doped semiconductor layer and the at least one p-doped semiconductor layer. The active layer is configured to emit primary radiation. Alternatively, the composite of conversion semiconductor chips includes a common semiconductor layer sequence. In each case one growth substrate is arranged downstream the common or each semiconductor layer sequence, in particularly directly downstream thereof. The composite of conversion semiconductor chips in each case includes an electric contact or a common contact, which at least electrically contacts a p-doped semiconductor layer, and in each case a further electric contact or a common electric contact, which electrically contacts at least the n-doped semiconductor layer. Both electric contacts are in particular arranged on the rear side of the common or the respective semiconductor layer sequence facing away from the growth substrate. The conversion semiconductor chips are in particular conversion flip chips. The conversion semiconductor chips have a common conversion layer in the composite of conversion semiconductor chips. The common conversion layer is arranged directly downstream of the respective growth substrates. In other words, the common conversion layer encloses the individual conversion semiconductor chips. The conversion layer can have a layer thickness from 1 μm to 1 mm, in particular from 20 μm to 400 μm.

In other words, a composite of conversion semiconductor chips is provided, wherein the conversion semiconductor chips have not yet been cut or singulated and are thus connected to one another at least through a common conversion layer.

In particular, the conversion semiconductor chips may comprise a common semiconductor layer sequence and/or an electric contact, so that, e.g., only the common growth substrate is cut, for forming the growth substrates of the respective conversion semiconductor chips. Alternatively, each conversion semiconductor chips comprises a distinct growth substrate, a distinct semiconductor layer sequence and/or a distinct electric contact, so that these are connected to one another only through a common conversion layer.

According to at least one embodiment, the common conversion layer covers at least the surface of the growth substrate and the side surfaces of the respective growth substrates. In particular, the conversion layer covers the side surfaces and the surfaces of the respective growth substrates in a form-fit manner.

According to at least one embodiment, the common conversion layer is additionally arranged on the respective side surfaces of the semiconductor layer sequence and/or of the side surfaces of the electric contact of the individual conversion semiconductor chips. In particular, the common conversion layer covers the side surfaces of the semiconductor layer sequence in a form-fit manner.

The inventors have found that by the application of the conversion layer within the completely processed conversion semiconductor chips, unnecessary individual placement of the chips for the application of the conversion layer is not required. This saves costs and time.

BRIEF DESCRIPTION OF THE DRAWINGS

Further advantages, advantageous embodiments and developments are indicated in the exemplary embodiments, which are described hereinafter in conjunction with the figures.

The figures show in:

FIGS. 1A to 1B, FIGS. 2A to 2D, FIGS. 3A to 3D, FIGS. 4A to 4D, FIGS. 5A to 5D, FIGS. 6A to 6E, FIGS. 8A to 8D, FIGS. 9A to 9D and FIGS. 10A to 10D schematically show side views of a method for producing conversion semiconductor chips according to an embodiment; and FIGS. 7A to 7C schematically show side views of a composite of conversion semiconductor chips according to an embodiment.

Figure 2A:
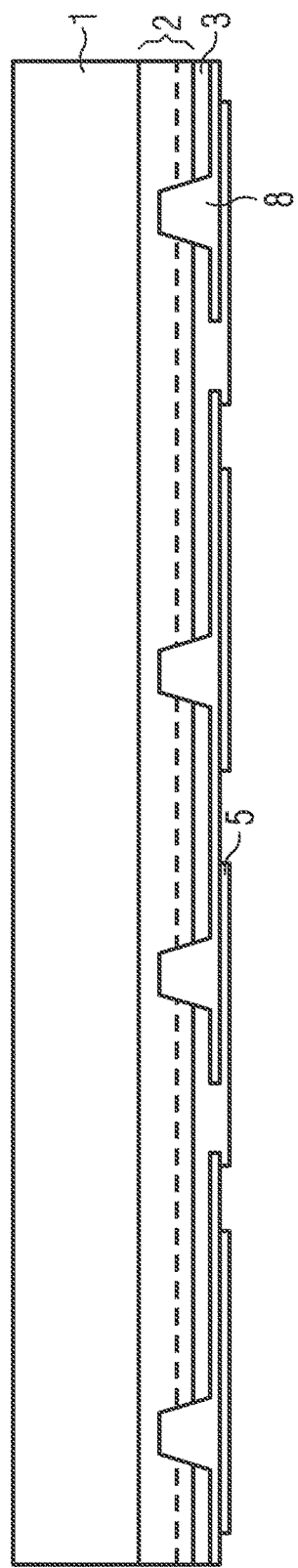

In the exemplary embodiments and figures, like, equivalent or elements acting in the same way can each be denoted with the same reference characters. The illustrated elements and the size ratios to one another are to be considered as not to scale. Rather, individual elements such as layers, components, devices and regions may be illustrated in an exaggerated size for the sake of a better illustration and/or a better understanding.

DETAILED DESCRIPTION OF ILLUSTRATIVE EMBODIMENTS

The FIGS. 1A to 1B show a schematic side view of a method for producing conversion semiconductor chips 61, 62 according to an embodiment. FIG. 1A shows the method step A). A growth substrate 1 is provided. The growth substrate 1 is in particular a sapphire substrate. FIG. 1B shows the method step B). In method step B), the semiconductor layer sequence 2 is applied on to, in particular grown, the growth substrate 1. In particular, the application of the semiconductor layer sequence 2 is effected directly, that is in direct mechanical contact to the growth substrate 1. The semiconductor layer sequence 2 is in particular arranged on the rear side 12 of the growth substrate 1. The semiconductor layer sequence 2 can include an aluminum nitride layer.

The methods for producing conversion semiconductor chips described hereinafter in the FIGS. 2A to 6E and 8A to 9D show the production of two conversion semiconductor chips in an exemplary manner. However, this method described herein is not only limited to the production of two conversion semiconductor chips, but also more than two conversion semiconductor chips can be produced with this method, in particular at the same time.

The conversion semiconductor chips described in FIGS. 2A to 7C can comprise insulation layers (not shown here).

In particular, the insulation layers are arranged between a first contact 3 and a further contact 8 for avoiding a short circuit.

FIGS. 2A to 2D schematically show a method for producing conversion semiconductor chips 61, 62 according to an embodiment.

Figure 2B:
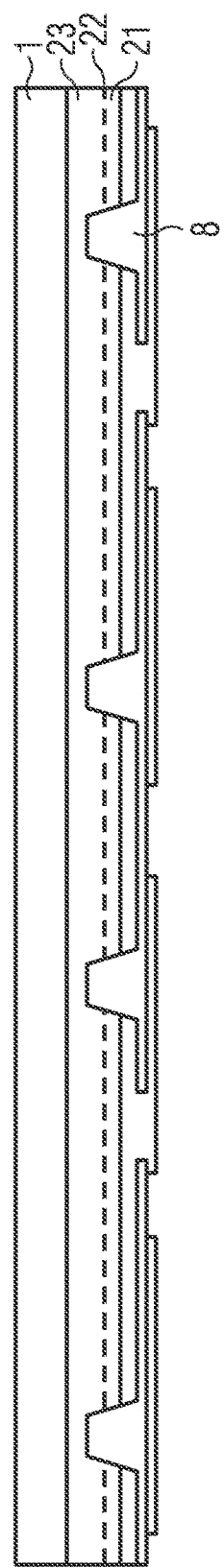

FIG. 2A shows a growth substrate 1, on which the semiconductor layer sequence 2 is grown. Furthermore, FIG. 2A shows the electric contact 3, which is formed as a layer, as well as the further electric contact 8, which extends into the n-doped semiconductor layer sequence 23. FIG. 2A shows the production method until method step C). Then, method step D) is effected, as shown in FIG. 2B, by thinning the growth substrate. In other words, the layer thickness of the growth substrate is decreased. Then, the application of the conversion layer 4 is effected, as shown in FIG. 2C. The conversion layer 4 is directly applied in particular over the entire growth substrate 1. Then, the method step F) is effected, in which a singulation takes place for generating optoelectronic conversion semiconductor chips, in this case the production of two optoelectronic conversion semiconductor chips 61, 62 in an exemplary manner. The resulting conversion semiconductor chips 61, 62 are in particular identical. The conversion semiconductor chips 61, 62 include a conversion layer 4, a growth substrate 1, a semiconductor layer sequence 2 and an electric contact 3. As an alternative or in addition, also rear side contacts 5 or further contacts 8 can be arranged. The singulation can be affected by means of sawing, stealth-dicing or laser-dicing. Then, after method step F), the singulated conversion semiconductor chips 61, 62 can be tested and packaged (not shown).

In particular, conversion semiconductor chips are produced with this method of FIGS. 2A to 2D, the chips each comprising a conversion layer 4 which in particular covers the surface of the growth substrate 1 in a form-fit manner. The side flanks 13 of the respective conversion semiconductor chips 61, 62 are not covered with the conversion layer 4, that is are free of the conversion layer 4.

Figure 3C:
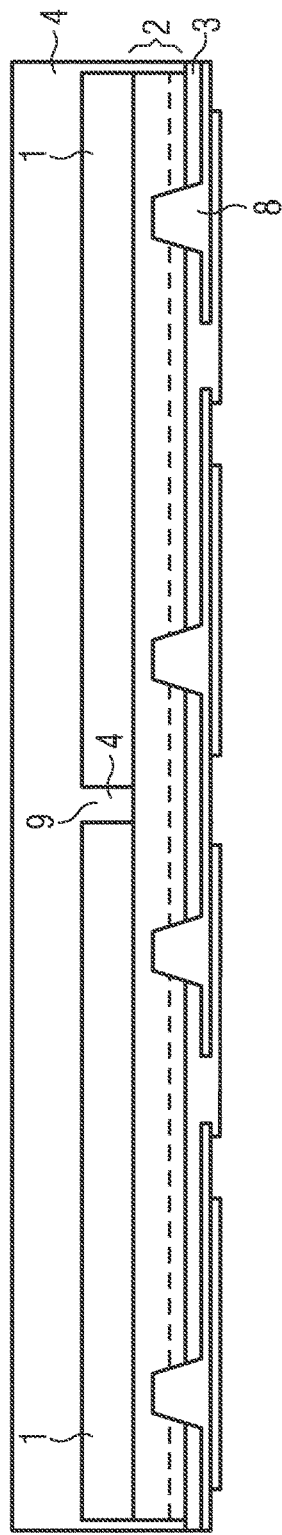
Figure 3D:
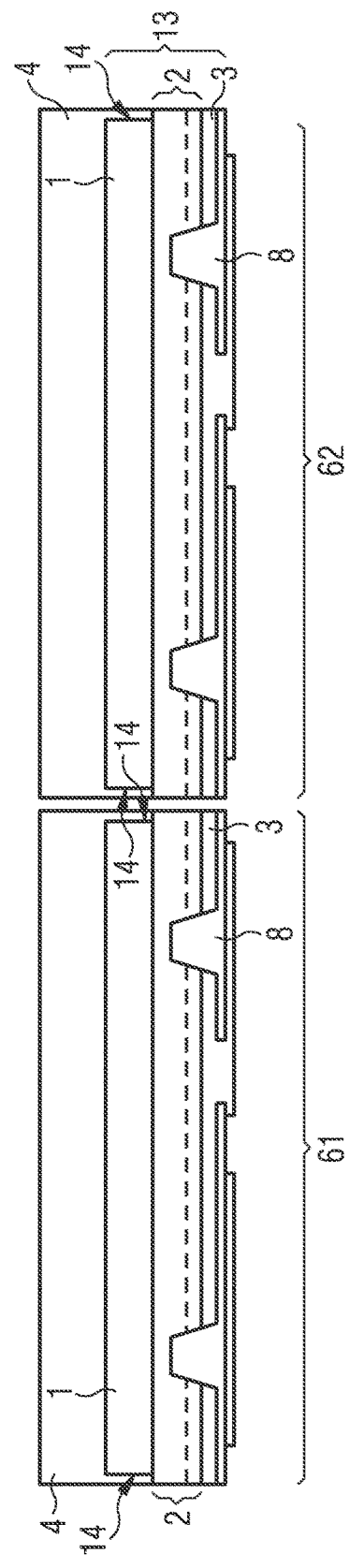

FIGS. 3A to 3D schematically show a method for producing conversion semiconductor chips 61, 62 according to an embodiment. FIG. 3A corresponds to FIG. 2A. Subsequently, method step D) is carried out, that is that the growth substrate 1 is thinned (FIG. 3B). Subsequently, at least the growth substrate 1 is cut. In particular, cutting is carried out vertically in a side view down to the semiconductor layer sequence 2. As a result, a first intermediate space 9, as shown in FIG. 3B or 3C, is formed. The conversion layer 4 can be arranged in this first intermediate space 9 in the subsequent method step E). In the subsequent method step F), shown in FIG. 3D, a singulation takes place and conversion semiconductor chips 61, 62 are generated, which each comprise a conversion layer 4 which at least partly cover the side flanks 13.

In particular, the side surfaces 14 of the growth substrate 1 are covered. The side surfaces of the semiconductor layer sequence 2 and of the electric contacts 3 are in particular free of the conversion layer 4. In particular, the conversion semiconductor chips 61, 62 are identical in construction.

Figure 4A:
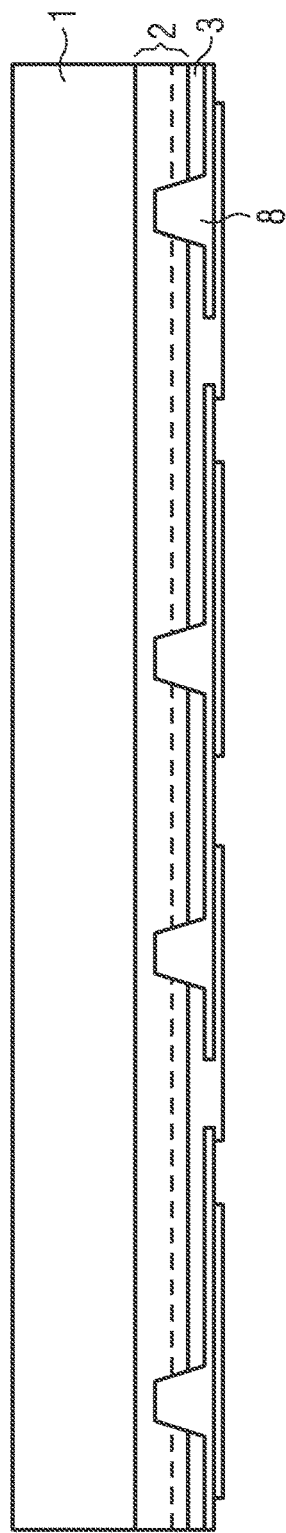
Figure 4B:
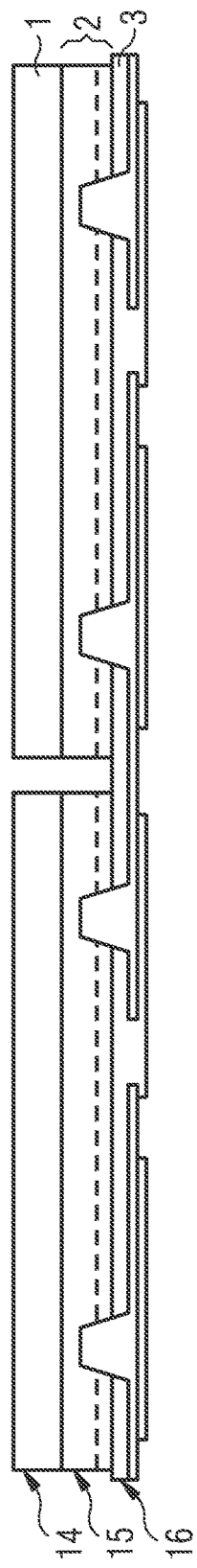

FIGS. 4A to 4D schematically show a method for producing conversion semiconductor chips 61, 62 according to an embodiment. FIG. 4A corresponds to FIGS. 2A and 3A. Then, it is shown in FIG. 4B that at least the thinned growth substrate 1 as well as the semiconductor layer sequence 2 are cut. Cutting is affected all the way down to the electric contact 3. In other words, the electric contact 3 is not cut. As a result, a second intermediate space 10 is formed between neighboring semiconductor chips 61, 62. It is shown in FIG. 4C that the conversion layer 4 is applied on to the surface of the growth substrate 1 and is additionally arranged in the second intermediate space 10. Thus, the conversion layer 4 covers the side surfaces 14 of the growth substrate as well as the side surfaces 15 of the semiconductor layer sequence 2. As shown in FIG. 4D, after the singulation, conversion semiconductor chips 61, 62 can be generated, which cover the side surfaces 14 of the growth substrate as well as the side surfaces 15 of the semiconductor layer sequence 2 with the conversion layer 4 in a form-fit manner. The side surfaces 16 of the electric contact 3 are in particular free of the conversion layer 4.

Figure 5C:
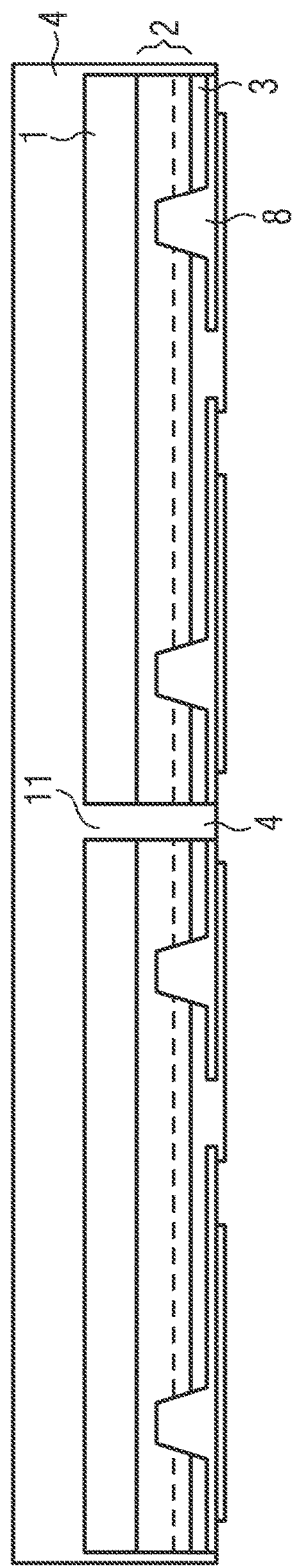
Figure 5D:
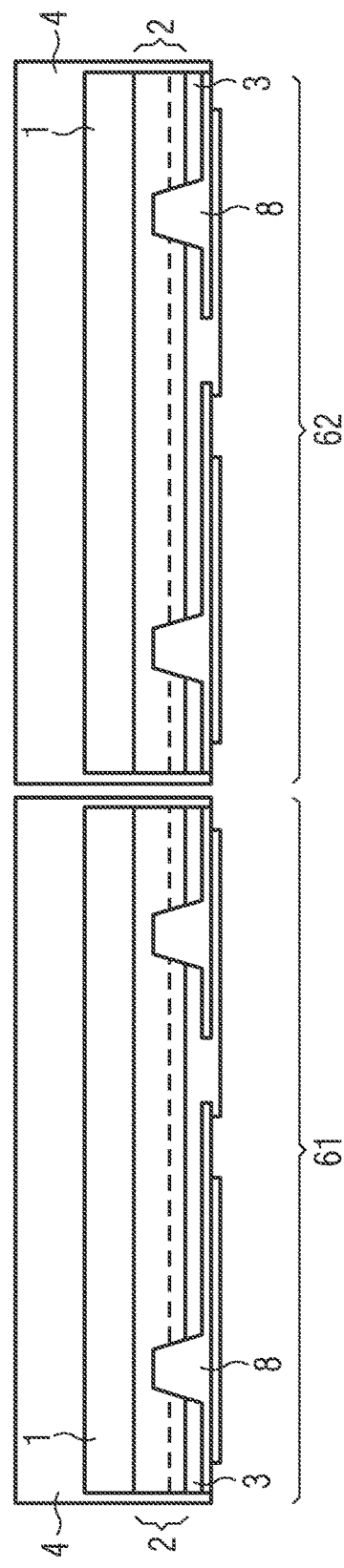

FIGS. 5A to 5D schematically show a method for producing conversion semiconductor chips 61, 62 according to an embodiment. FIG. 5A corresponds to FIGS. 2A to 4A. In FIG. 5B, method step D4) is shown. In method step D4), the growth substrate 1, the semiconductor layer sequence 2 and the electric contact 3 are cut. As a result, a third intermediate space 11 is formed between neighboring semiconductor chips 61, 62. In the subsequent method step E), the conversion layer 4 is applied and is also located in this third intermediate space 11. After the singulation in method step F), conversion semiconductor chips 61, 62 can be generated which comprise a conversion layer 4 on the side surfaces 14 of the growth substrate, on the side surfaces 15 of the semiconductor layer sequence 2 and as well on the side surfaces 16 of the electric contact. In other words, conversion semiconductor chips 61, 62 can be provided, which comprise a conversion layer 4 which covers the growth substrate 1 as well as the semiconductor layer sequence 2 and the electric contact 3 in a form-fit manner. Therefore, advantageously, no primary radiation can emerge from the side surfaces 14, 15 of the semiconductor layer sequence 2 or the growth substrate 1 and thus all of the primary radiation passes through the conversion layer 4 and can therefore at least partially be converted into secondary radiation.

Figure 6A:
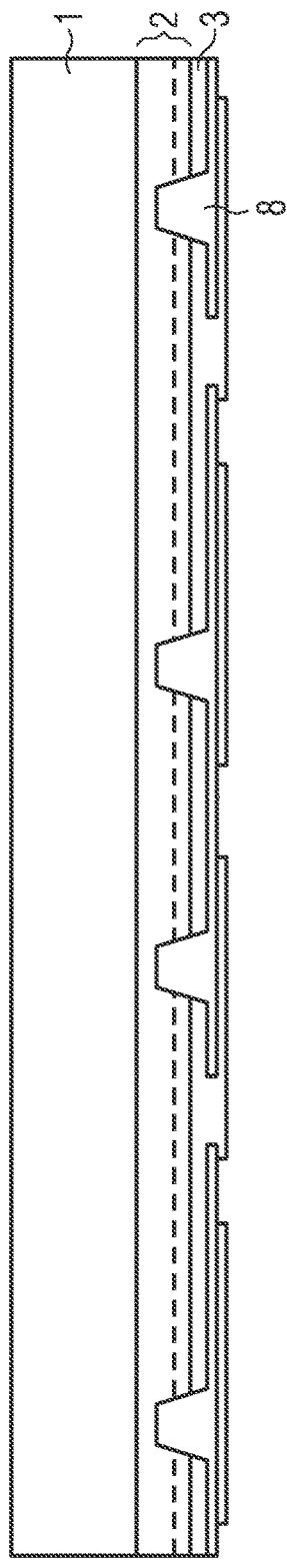
Figure 6B:
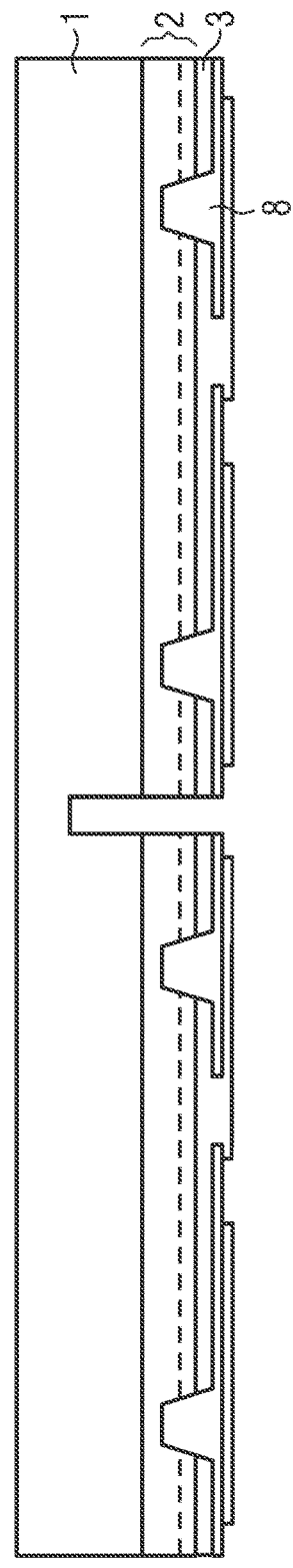
Figure 6C:
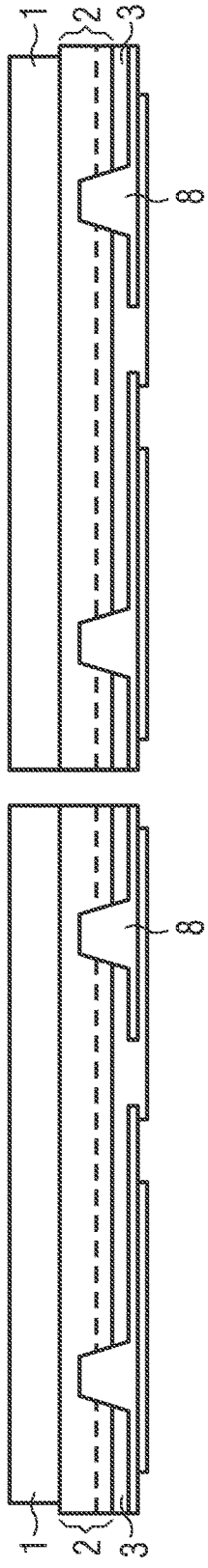
Figure 6D:
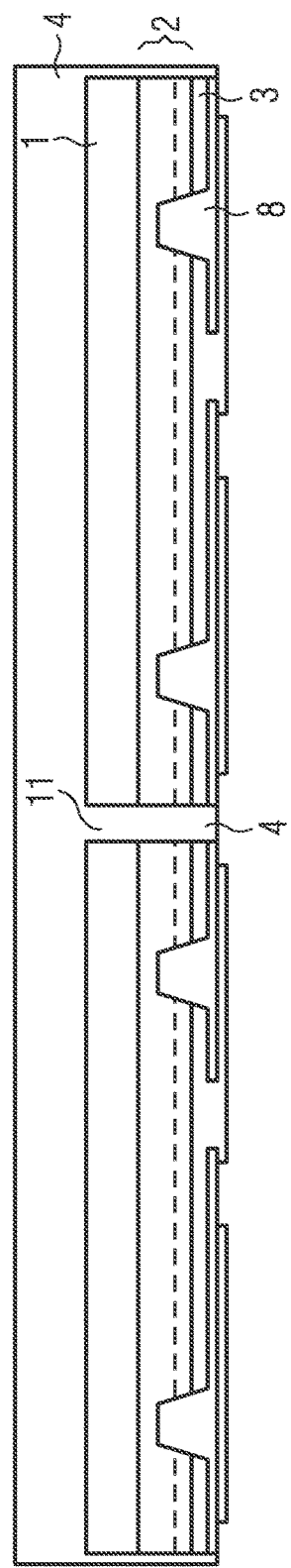
Figure 6E:
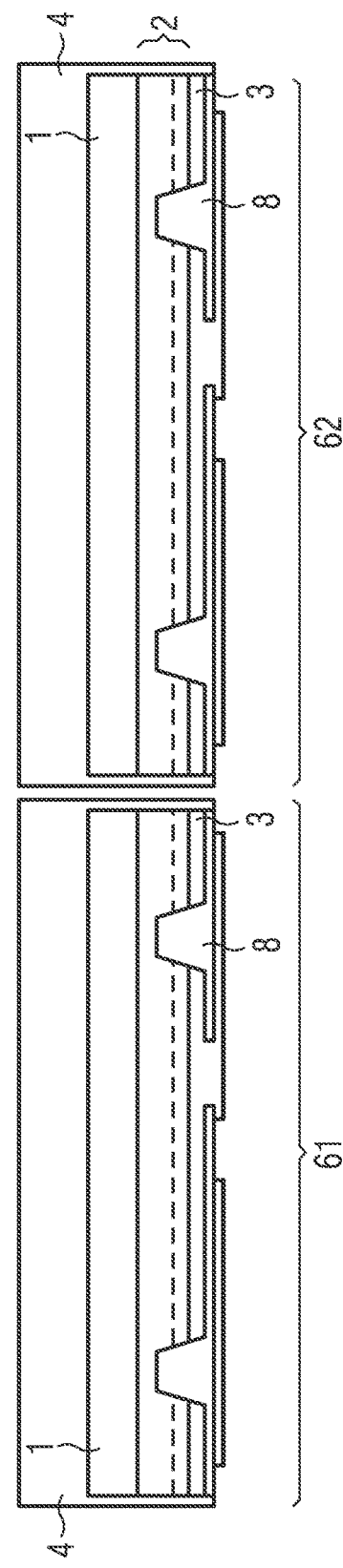

FIGS. 6A to 6E schematically show a method for producing conversion semiconductor chips 61, 62 according to an embodiment. FIG. 6A corresponds to FIGS. 2A to 5A. In FIG. 6B, it is shown that first the electric contact 3, then the semiconductor layer sequence 2, and then at least partially the growth substrate 1 are cut. Instead of the electric contact 3, a dielectric 17*a* or a metal layer 17*b* can be present, which is cut (not shown here). Subsequently, method step D) is carried out, i.e., the thinning of the growth substrate 1. In particular, the growth substrate 1 is ground deep enough that the cut part of the growth substrate 1 is reached. As a result, separated semiconductor chips can be generated, which are still free of a conversion layer 4 (FIG. 6C). These singulated semiconductor chips can be arranged on a temporary carrier (not shown). Subsequently, as shown in FIG. 6D, the conversion layer 4 can be applied. The conversion layer 4 attaches on the surface of the growth substrate 1 as well as in the third intermediate space 11. As a result, conversion semiconductor chips 61, 62 can be provided after the singulation, which comprise a conversion layer 4 that covers the surface of the growth substrate 1 as well as the side flanks of the semiconductor chips, that is the side surfaces 14 of the growth substrate 1, the side surfaces 15 of the semiconductor layer sequence 2 and/or the side surfaces 16 of the electric contact 3. In particular, the conversion layer 4 covers these side surfaces and the surface in a form-fit manner. Between the electric contact 3 and the conversion layer, a dielectric 17*a* or a metal layer 17*b* can be present (not shown here).

FIGS. 7A to 7C each show a schematic side view of a composite of conversion semiconductor chips. The composite of conversion semiconductor chips 61, 62 is illustrated in an example of two conversion semiconductor chips 61, 62. Alternatively, more than two conversion semiconductor chips can form a composite of conversion semiconductor chips. FIG. 7A corresponds to FIG. 3C. FIG. 7B corresponds to FIG. 4C. FIG. 7C corresponds to FIG. 5C. FIGS. 7A, B and C show a semiconductor layer sequence 2, downstream of a structured growth substrate 1 and a common conversion layer 4. The common conversion layer 4 directly covers the respective growth substrates 1. The composite of conversion semiconductor chips of the FIGS. 7A to 7C are different from one another in that the composite of the FIG. 7A has a first intermediate space 9, the composite of the FIG. 7B has a second intermediate space 10 and the composite of the FIG. 7C has a third intermediate space 11 between neighboring semiconductor chips. The first intermediate space 9 is formed by a structured growth substrate 1. The second intermediate space 10 is formed by a structured growth substrate 1 and a structured semiconductor layer sequence 2. The third intermediate space 11 is formed by a structured growth substrate 1, a structured semiconductor layer sequence 2 and a structured electric contact 3. Between the electric contact 3 and the conversion layer, in particular a dielectric 17a or a metal layer 17b can be present (not shown). The conversion semiconductor chips 61, 62 are connected in a composite by a common conversion layer 4.

In other words, the composite of conversion semiconductor chips 61, 62 of FIG. 7A includes a common semiconductor layer sequence 2, at least one common electric contact 3 and a common conversion layer 4. The conversion semiconductor chips 61, 62 of FIG. 7A each comprise a growth substrate 1.

In other words, the composite of conversion semiconductor chips 61, 62 of FIG. 7B includes at least one common electric contact 3 and/or a common conversion layer 4. For example, the composite does not include a common electric contact 3 if the same has already been cut before. The conversion semiconductor chips 61, 62 of FIG. 7B include in each case one growth substrate 1 and in each case one semiconductor layer sequence 2.

In other words, the composite of conversion semiconductor chips 61, 62 of FIG. 7C includes a common conversion layer 4. The conversion semiconductor chips 61, 62 of FIG. 7C include in each case one growth substrate 1, in each case one semiconductor layer sequence 2 and in each case at least one electric contact 3.

Figure 8C:
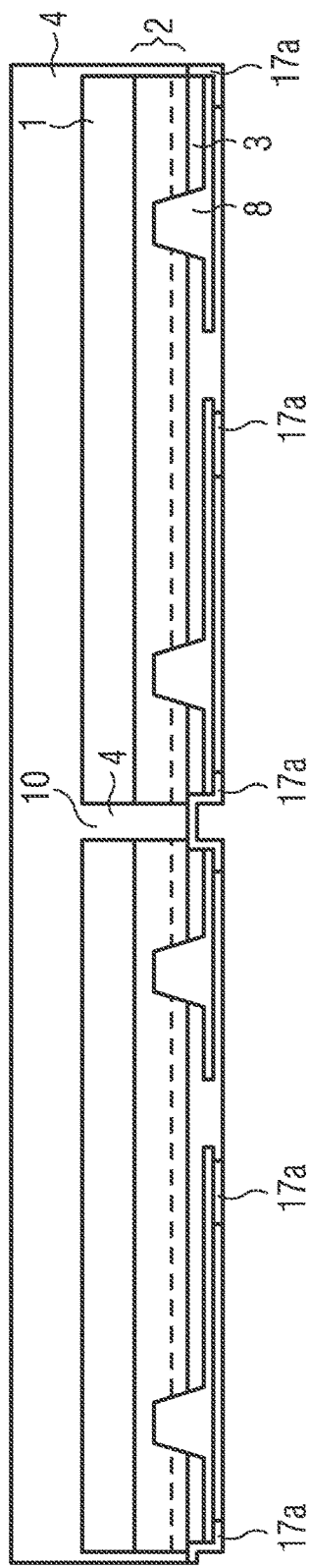
Figure 8D:
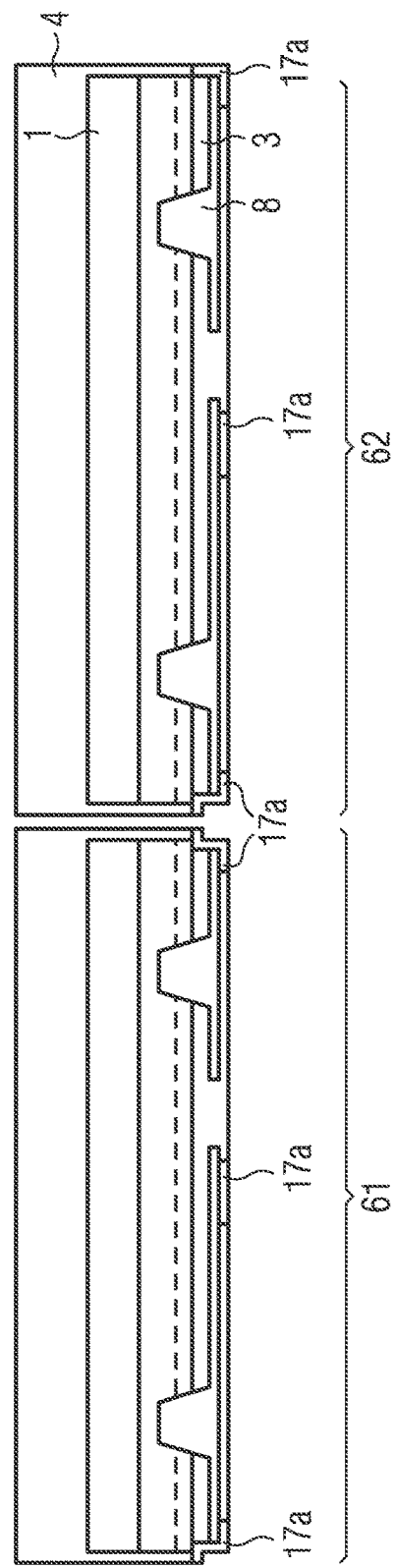
Figure 10A:
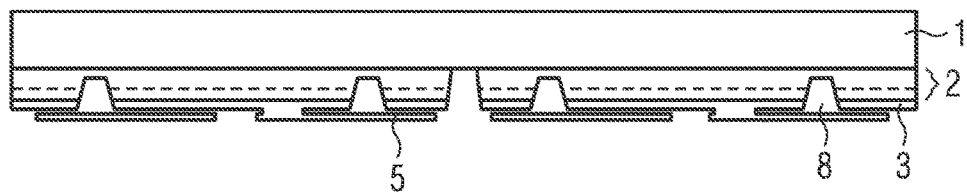
Figure 10B:
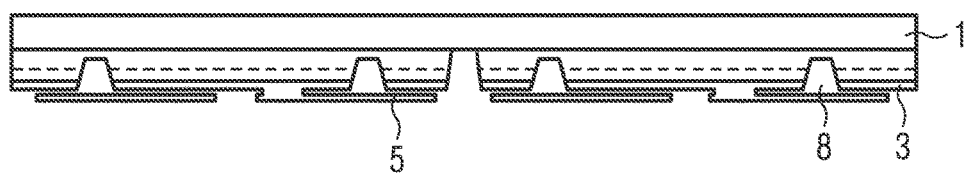
Figure 10C:
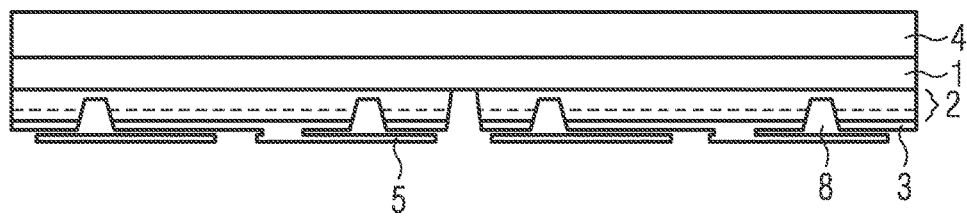
Figure 10D:
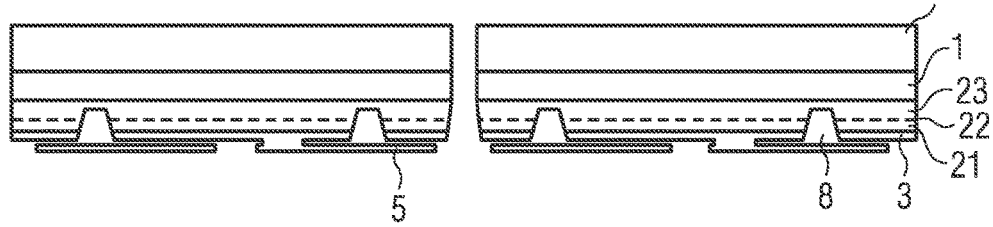

FIGS. 8A to 8D schematically show a method for producing conversion semiconductor chips 61, 62 according to an embodiment. FIGS. 8A to 8D substantially correspond to the FIGS. 4A to 4D with the exception that the neighboring semiconductor chips 61, 62 include further layers such as a dielectric 17a or a metal layer 17b (not shown here). These can serve to protect the conversion semiconductor chips 61, 62. In particular, the electric contact 3 and the further contact 8 of neighboring semiconductor chips 61, 62 are separated from one another by a dielectric 17a. Cutting of the layers is in this case not carried out down to the electric contact 3 or through the electric contact 3, as shown in FIGS. 4A to 4D, but to the dielectric 17a (FIG. 8B) or through the dielectric 17a (FIG. 8D).

FIGS. 9A to 9D schematically show a method for producing conversion semiconductor chips 61, 62 according to an embodiment. FIGS. 9A to 9D substantially correspond to FIGS. 5A to 5D with the exception that the neighboring semiconductor chips 61, 62 comprise further layers, such as a dielectric 17a or a metal layer 17b (not shown here). These can serve to protect the conversion semiconductor chips 61, 62. In particular, the electric contact 3 and the further contact 8 of neighboring semiconductor chips 61, 62 are separated from one another by a dielectric 17a. Cutting of the layers is not carried out through the electric contact 3, as shown in the FIGS. 5A to 5D, but through the dielectric 17a (FIG. 9B).

FIGS. 10A to 10D schematically show a method for producing optoelectronic conversion semiconductor chips 61, 62 according to an embodiment. FIGS. 10A to 10D substantially correspond to the FIGS. 2A to 2C. In contrast to the method of FIGS. 2A to 2C, the optoelectronic semiconductor components are singulated from the side facing away from the growth substrate, i.e., from the p-doped semiconductor layer to the n-doped semiconductor layer via the active layer. The developing intermediate spaces or trenches can also be overmolded by dielectrics or metals (not shown here). In addition or as an alternative, cutting or singulating can also be carried out only at least down to the growth substrate.

The exemplary embodiments and the features thereof described in conjunction with the figures can, according to further exemplary embodiments, also be combined with each other even if such combinations are not explicitly shown in the figures. Furthermore, the exemplary embodiments described in conjunction with the figures can comprise additional or alternative features according to the description in the general part.

The invention is not limited to the exemplary embodiments by the description of these exemplary embodiments. Rather, the invention includes any new feature as well as any combination of features, which in particular includes any combination of features in the claims, even if this feature or this combination is per se not explicitly stated in the claims or the exemplary embodiments.

The invention claimed is:
1. A method for producing optoelectronic conversion semiconductor chips, the method comprising:
   providing a growth substrate;
   growing a semiconductor layer sequence on the growth substrate;
   applying an electric contact to a rear side of the semiconductor layer sequence facing away from the growth substrate;
   thinning the growth substrate;
   after thinning, cutting the growth substrate and the semiconductor layer sequence to the electric contact, a dielectric or a metal layer thereby forming a second intermediate space, wherein the second intermediate space extends completely through the semiconductor layer sequence;
   applying a conversion layer to the thinned growth substrate, wherein the conversion layer is arranged in the second intermediate space; and
   singulating at least the thinned growth substrate and the semiconductor layer sequence for producing the optoelectronic conversion semiconductor chips.

2. The method according to claim 1, wherein applying the conversion layer comprising applying the conversion layer directly on to the thinned growth substrate, and wherein the conversion layer is configured to convert a primary radiation emitted by the semiconductor layer sequence at least partially into a secondary radiation different from the primary radiation.

3. The method according to claim 1, further comprising after singulating, generating the optoelectronic conversion semiconductor chips having side flanks, which are at least partially covered with the conversion layer.

4. The method according to claim 1, further comprising:
after thinning, cutting the growth substrate, the semiconductor layer sequence and the electric contact, a dielectric or a metal layer thereby forming a third intermediate space, wherein the conversion layer is also arranged in the third intermediate space; and
after singulating, generating the optoelectronic conversion semiconductor chips having side flanks, which are covered completely with the conversion layer.

5. The method according to claim 4, wherein the conversion layer at the side flanks has a layer thickness of 20 µm to 400 µm.

6. The method according to claim 1, wherein applying the conversion layer comprises molding, spray-coating or potting.

7. The method according to claim 1, wherein the conversion layer is applied as a paste, granulate or a solution.

8. The method according to claim 1, wherein singulating comprises sawing, stealth-dicing, laser-dicing, laser-separation or scoring and breaking.

9. The method according to claim 1, wherein the method, after singulating, further comprises:
testing the optoelectronic conversion semiconductor chips; and
packaging of the optoelectronic conversion semiconductor chips.

* * * * *